US00RE33859E

United States Patent [19]

Gurol

[11] E Patent Number: Re. 33,859

[45] Reissued Date of Patent: Mar. 24, 1992

[54] HERMETICALLY SEALED ELECTRONIC COMPONENT

[75] Inventor: I. Macit Gurol, Seattle, Wash.

[73] Assignee: John Fluke Mfg. Co., Inc., Everett, Wash.

[21] Appl. No.: 608,506

[22] Filed: Nov. 2, 1990

Related U.S. Patent Documents

Reissue of:

[64] Patent No.: 4,725,480
Issued: Feb. 16, 1988
Appl. No.: 779,643
Filed: Sep. 24, 1985

[51] Int. Cl.[5] ..... B32B 3/02

[52] U.S. Cl. ..... 428/76; 428/209; 428/426; 428/433; 428/901; 428/210; 361/397; 174/522; 501/13; 501/69

[58] Field of Search ..... 174/52.2; 361/397; 428/76, 209, 426, 433, 901, 210; 501/13, 17, 21, 69, 70

[56] References Cited

U.S. PATENT DOCUMENTS

| | | | |
|---|---|---|---|
| 3,859,126 | 1/1975 | Dietz et al. | 117/169 R |
| 3,964,920 | 6/1976 | Dain et al. | 106/53 |
| 4,025,669 | 5/1979 | Greenstein | 427/226 |
| 4,147,835 | 4/1979 | Nishimo et al. | 428/450 |
| 4,186,023 | 8/1987 | Dumesail et al. | 428/426 |
| 4,481,708 | 11/1984 | Bokil et al. | 29/588 |
| 4,537,863 | 8/1985 | Matsuura et al. | 501/15 |
| 4,621,064 | 11/1986 | Matsuura et al. | 501/15 |
| 4,622,433 | 11/1986 | Frampton | 174/52 FP |

FOREIGN PATENT DOCUMENTS

| | | |
|---|---|---|
| 1014735 | 12/1965 | United Kingdom . |
| 1015549 | 1/1966 | United Kingdom . |
| 1098752 | 1/1968 | United Kingdom . |

*Primary Examiner*—Patrick J. Ryan
*Attorney, Agent, or Firm*—Benjamin J. Hauptman

[57] ABSTRACT

A ceramic substrate supports a thin or thick film electronic circuit hermetically enclosed by a vitreous glass covering sealed to the ceramic substrate by a heat fused vitreous sealing glass. The vitreous sealing glass is screened onto the vitreous glass covering in a composition comprising a binder material and a liquifier. The electronic circuit is trimmed by a laser beam directed through the vitreous glass covering as one of the final process steps after completion of those process steps which tend to affect the resistivity of the resistive element; process steps such as high temperature baking and soldering of component parts.

23 Claims, 2 Drawing Sheets

HERMETICALLY SEALED ELECTRONIC COMPONENT

Matter enclosed in heavy brackets [ ] appears in the original patent but forms no part of this reissue specification; matter printed in italics indicates the additions made by reissue.

TECHNICAL FIELD

The present invention relates to apparatus and method for making electronic components and more particularly to hermetically sealing a glass or ceramic covering to a glass or ceramic substrate by sealing glass material which is heat fused to the covering and to the substrate.

BACKGROUND OF THE INVENTION

Microelectronic technologies commonly utilize both thin and thick film microcircuitry on a glass or ceramic substrate; thin films being generally less than 5 microns in thickness (per Mil Std 883-C and the International Society of Hybrid Microelectronics' definition) and thick films being considerably thicker. These films, comprising patterns of resistors, conductors, and sometimes capacitors applied by conventional film processing techniques, may include "add-on" discrete components such as transistors, diodes, etc., which are attached to the conductor and/or resistor portion of the pattern by solder, wire bonds, or other techniques. In the event a resistor film package is desired, there discrete add-on components are not included.

In thin film resistor technology, the resistor/conductor components are often made of vacuum deposited Nichrome, a registered trademark of Driver-Harris Co., comprising 80% by weight of nickel, 20% by weight of chromium. Thin film patterns are generally photoetched to be long and serpentine in order to provide a sufficient number of squares to achieve the required resistance, whereas thick film patterns are often rectangular, using various resistivity thick films.

When a thin film resistor is deposited, it is often desirable to temperature anneal the resistive element at high temperature in order to adjust its temperature coefficient of resistance (TCR). Typically, the resistive element/substrate is baked for an hour or so at a temperature of approximately 350° C. It is often then desirable to subject the resistive element/substrate to a stabilization bake where the resistive element is heated at a high temperature over a period of several days so that it will retain its desired resistive value when subjected to temperature cycling in an operational circuit. After the stabilization bake, the substrate is scribed into rows and columns so that it may be separated easily into individual die pieces. Package leads are then soldered to conducting "pads" located on the substrate surface, and these package leads may also be secured to the substrate by an epoxy. Other components, such as transistors, diodes, etc., are incorporated as part of the circuit, if desired.

Thick film technology components are fabricated in a multitude of steps beginning initially with the creation of a pattern or "mask" which provides an outline for depositing the resistor/conductor material onto the substrate. Commonly used mask materials include etched metal and emulsion-screens. Emulsion-screens are typically constructed of stainless steel woven mesh utilizing a mesh count of about 40 to 156 per centimeter.

The screens are coated with an emulsion which is hardened into a predetermined pattern by exposure to ultraviolet light, with the remaining non-hardened emulsion removed from that portion of the screen where the pattern is to be printed.

After the substrate is cleaned, typically by mechanical scrubbing action or by ultrasonic treatment utilizing deionized water or a proprietary soap, the substrate is blown off with nitrogen and the surface is dehydrated by baking in an oven for a specified time period.

After the substrate has been prepared, the screen is positioned relative to the substrate and the composition to be printed onto the substrate, often referred as an "ink", is applied to the screen. The "active" materials present in the ink composition depend upon the purpose for which the film is intended to be used. The active materials may comprise electrochemical metals or alloys for resistor films, or dielectric materials for insulating films. The screen is positioned a precise distance above the substrate defined as the "snap off distance". A mechanically operated squeegee is moved at a predetermined velocity across the top of the screen at a predetermined angle to push the ink composition through the screen and onto the surface of the substrate. After the squeegee has passed over a portion of the screen, the screen snaps off the surface of the substrate returning to its original position.

The consistency of the ink is important because it must have a sufficiently low viscosity to flow through the screen and then to settle onto the substrate filling in the gaps left by the screen, yet it must be sufficiently viscous to retain its basic shape after the screen has returned to its snap off position. An organic vehicle is normally included as part of the ink composition to provide the desired consistency. The flow characteristics of the ink composition are quite complex and are generally a function of the shear rate of the composition as it is pushed through the screen. The ink is dried and then it is fired in an oven where the organic vehicle and binders are burned off and the ink is bonded to the substrate.

Attachment of the package leads to the electronic circuitry inside the package is accomplished using thermal compression or ultrasonic sealing of aluminum or gold wire leads. The small diameter gold or alumina wire constitute a significant error factor in the overall value of the resistive element, particularly when these leads are applied to small value resistors.

In order to protect the thin or thick film electronic circuitry, as well as to provide a means for heat dissipation, film networks are packaged generally in metal, ceramic or plastic; plastic being the most popular because of its low cost. If, however, the anticipated operating environment of the package is projected to be severe, a hermetic enclosure or coating is required to enclose the electronic component in an inert, dry atmosphere. High temperatures and humidity accelerate chemical processes such as oxidation, corrosion and electrolytic action, which erode the metallic elements, whereas moisture absorption creates mechanical stresses which vary the resistance value of the resistive element.

The bonding materials normally used to provide severe environment hermetic seals are gold-tin eutectic solder or a solder glass such as $PbO—ZnO—Pb_2O_3$; these solders are for sealing primarily ceramic packages and are undesirable for precision components because of AC coupling effects. Glass is generally not used as a packaging material. This is because easy to seal glasses do not provide complete hermetic sealing while complete hermetic sealing glasses have high sealing temperatures which adversely affect the electronic component.

As noted above, a principal concern in the fabrication of film resistive elements is the maintenance of absolute, as well as relative, values of the patterned resistors. Absolute accuracy is defined as the difference between the actual value of the resistor and the denoted value of the resistor; whereas relative accuracy, which is critical when resistors comprise a voltage divider, is the difference between the actual ratio of the resistor values and the denoted ratio of the resistor values. Modern electronic instruments often require absolute and relative resistor accuracies of several parts per million.

Excellent absolute accuracy can be achieved by laser trimming the resistor pattern. Conventionally, laser trimming is accomplished prior to the final packaging of the resistive element. Packaging, however, whether it be plastic or metal, can often affect the precise resistor values achieved by laser trimming due to the deposition of materials onto the resistive element, as well as the high temperatures utilized in the packaging process.

Other conventional apparatus and methods include those described in U.S. Pat. No. 3,845,443—Fisher, which discloses a glass coated resistive thermometer comprising a resistive element supported on a alumina substrate and covered with a glass precoat. The resistive element and glass precoat are also coated with an alumina top coat which is "welded" to both the glass precoat and the resistive element.

In U.S. Pat. No. 3,926,502—Tanaka, et al, there is disclosed a liquid crystal display cell comprising two glass substrates disposed in a parallel, spaced apart relationship, and hermetically sealed together along their edges by a layer of glass having a melting point of about 450° C., thereby forming a space between the plates for receiving a liquid crystal substance.

In U.S. Pat. No. 3,412,462—Stutzman, et al, there is disclosed a method of making hermetically sealed thin film modules wherein a glass substrate blank is melted onto a metal substrate to form a hermetic glass-to-metal seal.

In U.S. Pat. No. 4,207,604—Bell, et al, there is disclosed a capacitive pressure transducer comprising a pair of disc-shaped members held in an adjacent parallel relationship by a glass frit fired to permanently fuse the two members in said relationship.

Although it has been recognized that glass materials may be fused as "covering" directly to metal and alumina substrates to provide a hermetic seal for electronic circuitry supported on the substrates, it has not been heretofore possible to fuse vitrified glass to a substrate at temperatures sufficiently low to avoid adversely affecting the electronic circuitry. Vitreous glass is a thermoplastic material which melts and flows at the same temperature each time it is thermally processed. Devitrified glass is a thermosetting material which crystalizes by surface nucleation on a time-temperature relationship.

Devitrified glass has been used in substrates because its thermal stability and chemical durability are improved over the original glass. Further, it will fuse at much lower temperatures than vitrified glass. Unfortunately, it is much more permeable to moisture than vitrified glass.

Further, conventional apparatus and methods have not provided for laser trimming of a hermetically sealed resistive element after completion of those process steps which can affect the absolute value of the resistive element.

SUMMARY OF THE INVENTION

Accordingly, it is a general aim of the present invention to provide an improved hermetically sealed electronic component and a method for making same. There is also provided a vitreous glass sealing composition for screening a heat fusible sealing glass onto the package components wherein the sealing composition exhibits good screening characteristics while maintaining its consistency.

The present invention further provides an improved electronic component on a ceramic substrate capped by a covering hermetically sealed by a vitreous glass sealing material.

In one of its more detailed aspects, the present invention provides an improved hermetically sealed device which comprises a ceramic substrate providing a base for supporting electronic circuitry thereon and method of making same. The hermetically sealed device also includes a vitreous glass covering to cover the electronic circuitry, and an agent for bonding the transparent glass covering to the substrate. The bonding agent provides a seal between the covering and the substrate to hermetically enclose the electronic circuitry. The bonding agent comprises a sealing glass composition heated to a sufficient temperature under a sufficient pressure to cause the sealing glass to fuse to the glass covering and to the substrate. The difference between the coefficient of thermal expansion of the substrate and the fused sealing glass is selected to be within about parts per million per degree centigrade. The sealing glass composition is fused to the substrate and to the glass covering at a temperature below about 380° C. during which time the sealing glass is compressed between the glass covering and substrate at a pressure of between 100 psi to about 1,500 psi.

In the preferred embodiment, the sealing glass is fused to the substrate and to the glass covering at a temperature between about 370° C. and about 375° C. during which time the sealing glass is compressed between the glass covering and the substrate at a pressure of about 200 spi. At atmospheric pressure, the sealing glass has an unacceptably high fusion temperature of about 415° C.

In an alternate embodiment, there is disclosed a hermetically sealed device comprising a ceramic substrate providing a base for supporting electronic circuitry thereon. The hermetically sealed deice includes a ceramic covering to cover the electronic circuitry and an agent for bonding the ceramic covering to the ceramic substrate. The bonding agent provides a hermtic seal between the covering and the substrate to hermetically enclose the electronic circuitry. The bonding agent comprises a sealing glass composition heated to a sufficient temperature to cause vitreous sealing glass to fuse to the covering and to the substrate. The difference between the coefficient of thermal expansion of the substrate and the fused vitreous sealing glass is selected to be within about parts per million per degree centigrade. The difference between the coefficient of thermal expansion of the ceramic covering and the fused vitreous sealing glass is also selected to be within about parts per million per degree centigrade.

In another embodiment of the present invention, there is disclosed a hermetically sealed device comprising a vitreous glass substrate to provide a base for supporting electronic circuitry thereon. The hermetically sealed device includes a glass material to cover the glass substrate and the electronic circuitry. The glass material comprises a vitreous sealing glass heated to a sufficient temperature to fuse the sealing glass to the substrate. The difference between the coefficient of thermal expansion of the fused vitreous glass and the vitreous glass substrate is selected to be within about parts per million per degree centigrade.

In another embodiment of the present invention there is disclosed a method of making a hermetically sealed device comprising the steps of providing a ceramic substrate for receiving electronic circuitry thereon and providing a vitreous glass covering to cover the electronic circuitry. The glass covering is joined to the substrate with a sealing composition which includes a vitreous sealing glass. The glass covering is fused to the ceramic substrate by heating the sealing composition to a temperature below about 380° C., and then compressing the sealing composition, during the heating step, between the glass covering and the ceramic substrate at a pressure between about 100 psi to about 1,500 psi. The sealing composition comprises an effective amount of the vitreous glass material in granular form, an effective amount of a cellulose binder, and an effective amount of a liquifier selected from the group consisting of pine oil or a dihydric alcohol having the formula:

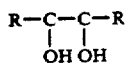

wherein R is H or $C_1$ to $C_3$ alkyl. The cellulose binder most preferably comprises hydroxypropyl cellulose, and the liquifier most preferably comprises pine oil.

The electronic circuitry preferably comprises a thin film resistive element. By covering the resistive element with a vitreous glass covering which is transparent at laser light frequencies, a laser beam may be directed through the glass covering, after the fusing step, to trim the resistive element to a predetermined resistive value. This results in precision resistor trimming because the trimming operation is conducted after those process steps which can affect the value of the resistive element.

In another embodiment of the present invention there is disclosed a method of making a hermetically sealed device comprising the steps of providing a vitreous glass substrate for receiving electronic circuitry thereon, and covering the electronic circuitry and the vitreous glass substrate with a sealing composition including vitreous sealing glass material therein. The vitreous sealing glass is fused to the glass substrate and to the electronic circuitry so as to hermetically seal the electronic circuitry by heating the sealing composition to the temperature below about 380° C. and compressing, during the heating step, the sealing composition against the glass substrate at a pressure between about 100 psi to about 1,500 psi.

While the present invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents and alternatives falling within the spirit and scope of the invention.

DESCRIPTION OF THE INVENTION

The present invention is particularly adapted for hermetically sealing a resistive element which is supported on a ceramic or glass substrate with a glass or ceramic covering. By the term "resistive element", it is meant to include an individual resistor as well as a plurality of resistors which may comprise a thin or thick film voltage divider network or the like. The following invention will be described with reference to hermetically sealed thin film resistive elements which is the preferred embodiment, as well as with reference (i) to the processes used for making such hermetically sealed resistive elements and (ii) to compositions used to hermetically seal the resistive elements. It should be understood, however, that the present invention has broader applications to other hermetically sealed packages such as integrated circuits, including monolithic bipolar and MOS (metal oxide semiconductor) monolithic integrated circuits.

Figure 1:
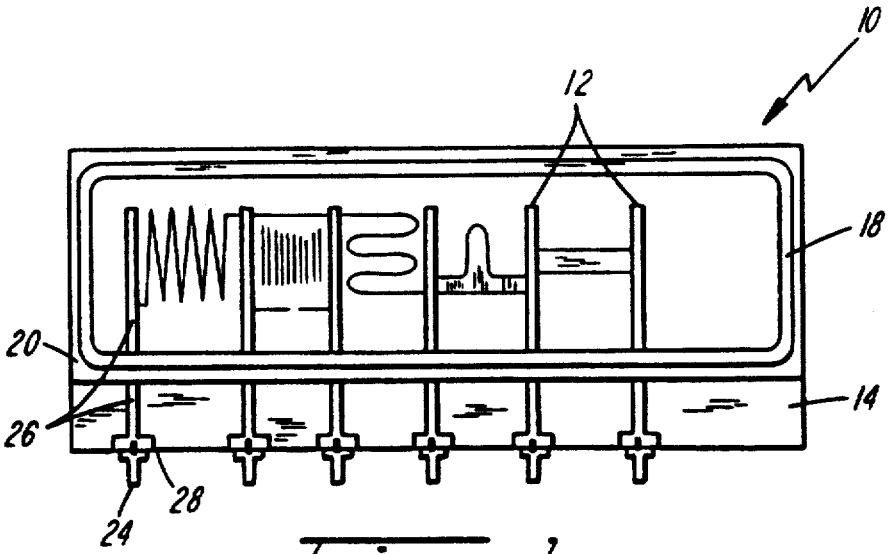
FIG. 1 is a top view of a resistor package including a glass covering heremetically sealed to a substrate enclosing therein a thin film resistive element.

In FIG. 1 therein is shown the preferred embodiment of the present invention comprising a thin film resistor package indicated at 10, including a thin film resistive element 12 supported on a ceramic substrate 14. Resistive element 12 is enclosed and hermetically sealed by a vitreous glass covering 18 which is bonded to the surface of substrate 14 by a heat fusible, vitreous sealing glass 20 (better shown in FIG. 2), located around resistive element 12. Resistor package 10 includes package leads 24 projecting outwardly from the edge of substrate 14 parallel to the plane thereof for connecting resistor package 10 to an electronic circuit (not shown). package leads 24 engage a conductive bonding pad 28 located on the surface of substrate 14 which is connected to resistive element 12 via conductor leads 26 which are supported on the surface of substrate 14.

To provide a suitable base for supporting elemental metals forming the thin film electronic circuitry of the present invention and in particular resistive element 12, the ceramic substrate 14 is selected to have the desirable thermal conductivity, dielectric constant, electrical nonconductivity, surface smoothness and mechanical strength, when subjected to temperature extremes from about −55° C. (minimum operational temperature) to about 380° C. (the maximum fabrication temperature). The term "ceramic" is meant to include those non-metallic inorganic materials formed through heat processing which are typically used in microelectronic component substrates and component parts. The ceramic substrate 14 is generally selected from the group of ceramics consisting of alumina, beryllia, steatite, titanium dioxide, magnesium alumina silicate, silicon carbide, and zircon or combinations thereof. Preferably, however, ceramic substrate 14 is comprised of alumina or beryllia, and most preferably of alumina. Preferably, the alumina composition of substrate 14 is greater than 90%; more preferably the alumina composition of substrate 14 is greater than 96%; and most preferably the alumina composition of substrate 14 is greater than 99%.

Glass covering 18 is a dispersed mixture of silica, soda ash and lime, and often combined with metal oxides such, for example, as boron, calcium, lead, lithium, titanium and cerium, depending upon the specific properties desired, which are heated to a fusion temperature and the cooled to a rigid state; preferably glass covering 18 is made from Micro Sheet, a registered trademark of Corning Glass Works, Glass Code 0211, and which is a vitreous borosilicate glass. The glass of glass covering 18 is selected to be transparent to laser energy to allow conventional laser trimming of resistive element 12 in a manner to be described in greater detail hereinafter. Additionally, it is preferable that glass covering 18 be transparent to visible light to allow for normal inspection of the resistive element 12.

The glass in the glass covering 18 is selected to have a coefficient of thermal expansion substantially similar to the coefficient of thermal expansion of substrate 14 through the temperature extremes, and which has a softening temperature at least 50° C., above the fusion temperature of the vitreous sealing glass 20 at the same pressure (e.g. 420° C. at 200 psi). By "softening" temperature it is meant the temperature at which the glass first exhibits loss of its structural rigidity; by the term "fusion temperature" it is meant the temperature at which the granules of the vitreous sealing glass 20 bond with each other as well as to any material which they are in contact with.

The vitreous sealing glass 20, a ceramic glass consists of a uniformly dispersed mixture of silica, soda ash and lime often combined with metal oxides such as boron, calcium, lead, depending upon the specific properties desired. The glass 20 has a low melting temperature and, in its unfused state, the sealing composition is granular in nature having particles of a specific size. It belongs to that class of materials known as "glass frits" which are commonly used to join materials such as ceramics and metals when heated to the fusion temperature.

In order to reduce mechanical stresses between sealing glass 20, glass covering 18 and substrate 14 caused by temperature extremes which can result in package 10 losing its hermetic seal, the difference in the coefficient of thermal expansion between fused sealing glass 20 and glass covering 18, and between fused sealing glass 20 and substrate 14 should be preferably within two (millionths $2\times10^{-6}$), and more preferably within one (millionth $1\times10^{-6}$). The total difference between the glass covering 18 and the substrate 14 should not be greater than four (millionths $4\times10^{-6}$). The desired percentage of alumina in substrate 14 is a function of the difference in coefficients of thermal expansion between substrate 14 and fused sealing glass 20, as well as a function of the ability of sealing glass 20 to bond with substrate 14.

Figure 2:
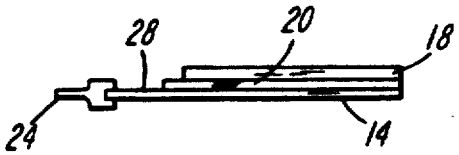
FIG. 2 is a side view of the resistor package of FIG. 1.
Figure 3:
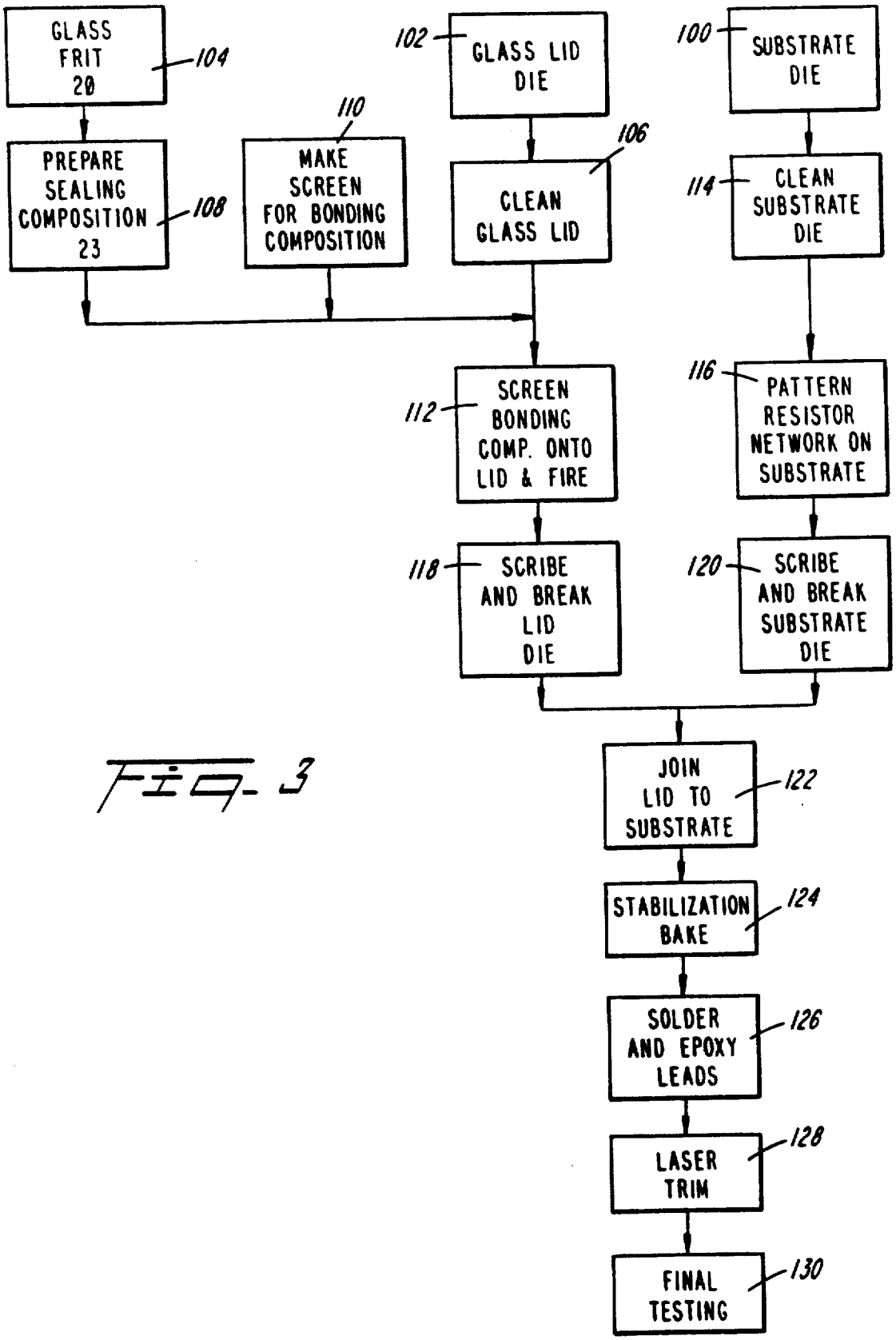
FIG. 3 is a flow chart depicting a process for hermetically sealing a glass covering to a ceramic substrate.

Referring now to FIG. 3 there is shown a flow chart depicting a preferred process for fabricating resistor package 10 illustrated in FIGS. 1 and 2. Starting materials include substrate 14 in block 100, glass covering 18 in block 102 and glass frit 21 in block 104. To apply the glass frit 21 to covering 18 which is cleaned in block 106, a binder material is used to hold the granular particles of glass together. A liquifier is included with the binder material to reduce the viscosity thereof to form the sealing composition 23 in block 108. The viscosity should be sufficiently low to allow the sealing composition 23 of glass mixture, binder and liquifier, to be deposited onto a screening apparatus and pushed through a screen, prepared in block 110, onto covering 18. The liquifier should not be so volatile as to evaporate between successive applications of the sealing composition, yet it should be sufficiently volatile to evaporate when raised to the fusion temperature of sealing glass 20.

A preferred sealing composition 23 includes an effective amount of a cellulose binder; more preferably the binder is hydroxalkyl cellulose wherein the alkyl group contains from 1 to 4 carbon atoms; and most preferably the binder comprises hydroxypropyl cellulose.

The sealing composition is formed by adding, to an effective amount of binder, an effective amount of a liquifier selected from the group consisting of pine oil having a distilling range between about 200° C. and about 225° C. and comprising secondary and tertiary terpene alcohols, or dihydric alcohols having the formula:

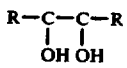

wherein R is H or $C_1$ to $C_3$ alkyl or more preferably the liquifier is pine oil. The binder/liquifier mixture when combined with the glass frit 21 results in a sealing composition 23 which has excellent consistency when deposited on a screening device, which flows through the screening device when subjected to a pushing force, and which regains its consistency when deposited on substrate 14 thereby maintaining the shape of the screen pattern. So as not to adversely affect resistive element 12, the liquifier/binder composition decomposes within one hour at firing temperatures below 420° C. and more preferably below 350° C.

It should be appreciated that the amount of granulated glass utilized will depend upon the area of substrate 14 desired to be covered as well as the desired thickness of sealing glass 20. On the other hand, the relative amounts of binder and liquifier will depend largely upon the screen mesh size used in depositing the composition. A larger screen mesh size normally requires a smaller ratio of liquifier to binder, whereas a smaller screen mesh size will require a larger ratio of liquifier to binder. However, when utilizing a binder of hydroxypropyl cellulose and a liquifier of pine oil with a screen mesh size of 165, the ratio in parts by total weight of binder/liquifier to sealing glass is from about 1:2 to about 1:9 wherein the ratio of parts by total weight of liquifier to binder is about 25:1 to 250:1; a preferred sealing composition comprises a ratio in parts by total weight of liquifier/binder to sealing glass of about 1125 to 166, wherein the ratio of parts by total weight of liquifier to binder is about 165 to 1.

The sealing composition 23 is deposited on glass covering 18 utilizing a thick film screening process wherein a screen pattern is prepared using conventional techniques described previously. The sealing composition is deposited onto a screen positioned horizontally above glass covering 18 and the pushed through the screen onto glass covering 18 by a horizontally propelled squeegee in a manner known to one of ordinary skill in the art. Adjustments to squeegee pressure, horizontal velocity, and snap off distance are made to obtain the sharpest possible pattern by observing the lay down. It should be appreciated that the sealing composition 23 may be screened onto substrate 14 instead of glass covering 18, although screening the sealing composition 23 onto glass covering is preferable. Often substrate 14 will include a protective oxide layer, such as silicon oxide when substrate 14 comprises an alumina composition, so that sealing glass 20 is fused directly to the substrate oxide layer.

In an exemplary embodiment of the present invention illustrated in FIG. 1, a screen pattern is designed to deposit annular patterns of sealing composition 23 onto a sheet of glass coverings, called a die, so that when a covering 18 is bonded to a substrate 14 the sealing glass 20 surrounds a resistive element 12 and covers a portion of conducting leads 26. The thickness of sealing composition deposited on glass covering 18 is dependent upon the smoothness of the surface of glass covering 18 and substrate 14. It is important that sufficient sealing glass 20 be deposited onto glass covering 18 to fill in any imperfections or "valleys" which may exist later when substrate 14 and glass covering 18 are joined together. In addition, it is preferable to achieve a thickness of sealing glass 20 such that when substrate 14 and glass covering 18 are compressed together a small gap filled with the sealing glass 20 exists between their respective parallel surfaces. In order to achieve these desired results, the sealing composition 23 is applied to the glass covering die in block 112 at a thickness of about 6 mils, later when being fused, the sealing composition will be compressed to approximately 3 mils when pressure is applied to bring glass covering 18 and substrate 14 together. To deposit the desired thickness of the sealing composition onto glass covering 18, it is preferable to use a double additive process wherein a layer of sealing composition is deposited and dried, and a second layer is deposited onto the first layer and then dried thereon. The glass covering 18 are then fired to remove the binder and vehicle from the sealing composition 23.

After cleaning substrate die in block 114, resistive element 12 is added thereto in block 116. The term "added" is meant to encompass both thin and thick film additive and subtractive processes such as, but not limited to, vacuum deposition, screening, wet chemical etching, dry chemical etching such as sputter etching, plasma etching and ion beam etching, as well as other microelectronic patterning processes known to those persons of ordinary skill in the art.

After the glass covering die and substrate die have been scribed and broken into individual glass covering 18 and individual substrates 14 in blocks 118 and 120, respectively, glass covering 18 is placed against substrate 14, and sandwiching the sealing glass 20 therebetween in preparation for fusion in block 122.

Resistive element 12, particularly if made of Nichrome, is temperature sensitive such that temperatures above 380° C. may cause resistive element 12 to become unstable and to change from its desired resistive value. Conventional vitreous sealing glasses, including the sealing vitreous sealing glass 20, will not fuse below 400° C. It has been found, in the present invention that compression of the vitreous sealing glass 20 between glass covering 18 and substrate 14 for a period between 5 minutes to 2 hours, and preferably ½ hour, at compression pressure applied to glass covering 18 and substrate 14 between about 100 to about 1,500 psi, and preferably at about 200 psi, causes fusion of the sealing glass 20 to glass covering 18 and substrate 14 at temperatures below 380° C. At temperatures from about 370° C. to about 375° C. and about 200 psi it is possible to obtain a moisture impermeable hermetic vitreous glass seal between glass covering 18 and substrate 14. Because sealing glass 20 is fused at temperatures similar to those used for adjusting the temperature coefficient of resistance (TCR) of resistive element 12, there is no need for a separate TCR adjusting step as absolutely essential utilized in conventional resistor fabrications.

Fused sealing glass 20 forms a hermetic seal across conducting leads 26 to maintain the hermeticity of package 10. The air trapped in the space defined by the opposing surfaces of glass covering 18 and substrate 14 and by sealing glass 20 is relatively dry so as not to adversely affect resistive element 12 hermetically enclosed therein. Sealing glass 20, although in contact with conductor leads 26, is non-conductive and therefore does not interfere with the conductivity of leads 26. In addition, the glass-to-metal interface between fused glass 20 and conductor leads 26 does not significantly increase capacitive coupling when resistor package 10 is used in high frequency applications.

After joining glass covering 18 to substrate 14, a stabilization bake step may be performed in block 124 to stabilize resistive element 12 against changes in its resistivity when it is eventually placed in a operational environment and cycled through various temperatures. The stabilization bake is conducted at temperatures between 100° C. to 200° C. which is sufficiently low to avoid adversely affecting the resistive properties, such as TCR, of resistive element 12.

After the stabilization bake, package leads 24 are soldered to pads 28 and then epoxied to substrate 14 in block 126. The number and location of package leads 24 is a function of the intended use of resistive package 10, however, it is understood that package leads may be positioned on substrate 14 as illustrated in FIG. 1 to form a single in-line package (SIP); or at opposite sides of substrate 14 to form a dual in line package (DIP); or at all sides of substrate 14. Further, solderable pads may be proved for surface mounting. In addition, package leads 24 may be mounted perpendicular as well as parallel to the plane of substrate 14.

Connecting leads 26, which connect resistive element 12 to package leads 24, are patterns of elemental metal deposited on substrate 14, the resistivity of which is controlled by the geometry of the lead pattern as well as the material selected to form the leads. Therefore, when resistive element 12 comprises a small value resistor, the pattern chosen for connecting leads 26 is enlarged to reduce the resistivity thereof and thus reduce any error introduced into the value of resistive element 12. Preferably, connecting leads 24 comprise a sandwich of metal depositions including an initial Nichrome layer deposited onto substrate 14, and a nickel layer deposited on top of the Nichrome layer. A gold layer may be deposited on the nickel layer in order to achieve a very low resistivity.

It can be appreciated that many of the previously discussed steps for fabrication of resistive package 10, such as heat fusion of the sealing glass to glass covering 18 and substrate 14, as well as soldering of package leads 24 to bonding pads 28, tend to introduce incremental changes into the value of resistive element 12 when these processes are performed prior to precision trimming of resistive element 12. The transparent glass covering 18 used in the present invention, however, allows for laser trimming in block 128 of resistive element 12 as one of the final steps in the fabrication of resistor package 12 and after completion of those process steps which affect the value of resistive element 12 and after completion of the stabilization bake process step.

In the present invention laser trimmings conducted after hermetic packaging by directing the laser beam through glass covering 18 and onto resistive element 12 to remove, as well known in the art, various shunts which affect resistance. Greater trimming precision is achieved in the present invention because those process steps which affect the value of resistive element 12 have been completed prior to laser trimming. It has been found in final testing in block 130 that the removal of minute portions of resistive element 12 during the trimming operation in a hermetically sealed space has little or not adverse effect on the resistance.

Where the covering is made from a non-transparent material, the stabilization and laser trimming steps are performed prior to fusing covering 18 to substrate 14 as would be evident to those skilled in the art.

Figure 4:
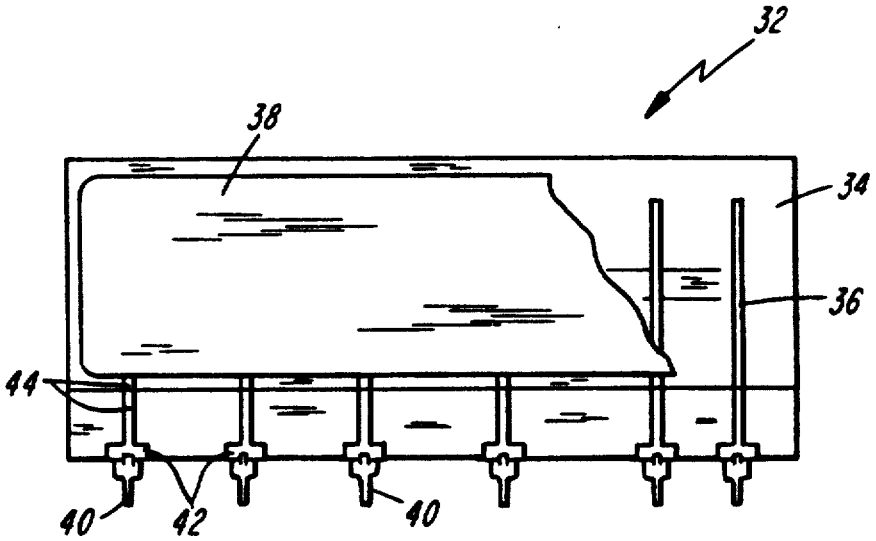
FIG. 4 is a top view of a resistor package including a glass substrate supporting a thin film resistive element thereon wherein the resistive element and substrate are covered by a fused glass material.

In another embodiment of the present invention, there is illustrated in FIG. 4 a resistor package indicated at 32 including a transparent vitreous glass substrate 34 supporting a thin film resistive element 36. The substrate 34 is dispersed mixture of silica, soda ash, and lime often combined with such metal oxides as boron, calcium, lead, etc. depending upon the specific properties desired; a typical example of which is Pyrex Glass Brand No. 7740, a borosilicate glass and a registered tradmark of Corning Glass Works.

The resistive element 36 is encapsulated in a vitreous glass covering 38 which is identical to the composition of the sealing glass which was heat fused to form fused sealing glass 20 (FIG. 2) used in the fabrication of resistor package 10. This glass covering 38 is formulated in a sealing composition identical to that sealing composition used in the fabrication of resistor package 10. The resistor package 32 includes package leads 40 projecting outwardly from the edge of substrate 34 parallel to the plane thereof for connecting resistor package 32 to an electronic circuit (not shown). Each package leads 40 engages a conductive bonding pad 42 located on the surface of substrate 34 which is connected to resistive element 36 via respective conductor leads 44 which are supported on the surface of substrate 34.

The process steps depicted in FIG. 3 for fabricating package 10 are identical with those described in fabrication of resistor package 32 except: (i) the screen pattern used for depositing sealing glass 20 in an annular configuration is modified to provide a deposition of glass coating 38 over the entire surface of resistive element 36 and a portion of the surrounding substrate 34; and (ii) there is no separate covering 18 utilized in this embodiment, therefore glass covering 38 is screened directly onto glass substrate 34 where it is subjected to the time/temperature cycling parameters described in the preferred embodiment in order to obtain a sealed vitreous glass bonded with substrate 34. It has been found that pressure is not an absolute requirement for this embodiment.

The stabilization bake process and laser trimming steps are conducted as described previously for fabrication of resistor package 10 although sequentially they could be performed prior to deposition of the glass coating 38. When it is desired to laser trim as one of the final process steps, the laser trim is accomplished by directing the laser beam through the transparent glass substrate 34. Therefore, the material of substrate 34 must be transparent to the frequency of laser light being employed for trimming.

As many possible embodiments may be made of the invention without departing from the scope thereof, it is to be understood that all matters set forth herein and shown in the accompanying drawings are to be interpreted in an illustrative and not a limiting sense.

What is claimed is:

1. A hermetically sealed device comprising:
a substrate providing a base for supporting electronic circuitry thereon;
electronic circuitry disposed on said substrate; and
a vitreous glass covering disposed over and hermetically sealing said electronic circuitry with said vitreous glass covering sealed onto said substrate, wherein said vitreous glass covering has a sealing temperature below about 380° C. *at pressures above about 100 psi.*

2. The invention as claimed in claim 1 wherein said vitreous glass covering has a sealing temperature between about 370° C. and 375° C.

3. A hermetically sealed device comprising:
a substrate providing a base for supporting electronic circuitry thereon;
electronic circuitry disposed on said substrate; and
a vitreous glass covering disposed over and hermetically sealing said electronic circuitry with said vitreous glass covering sealed onto said substrate, wherein the coefficient of thermal expansion between said substrate and said vitreous glass covering is within about two millionths ($2\times10^{-6}$)°C. *wherein said vitreous glass covering has a sealing temperature below about 380° C. at a pressure above about 100 psi.*

4. A hermetically sealed device comprising:
a substrate providing a base for supporting electronic circuitry thereon;
electronic circuitry disposed on said substrate; and
a vitreous glass covering disposed over and hermetically sealing said electronic circuitry with said vitreous glass covering sealed onto said substrate, wherein said vitreous glass covering is transparent to light at laser frequencies *wherein said vitreous glass covering has a sealing temperature below about 380° C. at a pressure above about 100 psi.*

5. A hermetically sealed device comprising:
a substrate providing a base for supporting electronic circuitry thereon;
electronic circuitry disposed on said substrate; and
a vitreous glass covering disposed over and hermetically sealing said electronic circuitry with said vitreous glass covering sealed onto said substrate, wherein said substrate is selected from a group consisting of alumina, beryllia, steatite, magnesium alumina silicate, titanium dioxide, silicon carbide, and zircon; and said vitreous glass covering is a uniformly dispersed mixture of silica, soda ash, and lime combined with metal oxides from the group consisting of boron, calcium, lead, lithium, titanium, and cerium *wherein said vitreous glass covering has a sealing temperature below about 380° C. at a pressure above about 100 psi.*

6. A hermetically sealed device comprising:
a substrate providing a base for supporting electronic circuitry thereon;

electronic circuitry disposed on said substrate;

a covering disposed over said electronic circuitry; and a vitreous glass seal disposed around said electronic circuitry fused to said covering and said substrate to hermetically seal said electronic circuitry wherein said vitreous glass seal has a fusion temperature below about 380° C. at pressures above about 100 psi.

7. The invention as claimed in claim 6 wherein said covering is a vitreous glass having a softening temperature at least 50° C. above the fusion temperature of said vitreous glass seal at the same pressure.

8. The invention as claimed in claim 7 wherein the difference in the coefficient of thermal expansion between said vitreous glass covering and said vitreous glass seal is within two millionths ($2\times10^{-6}$) per °C.

9. The invention as claimed in claim 8 wherein said vitreous glass covering is transparent to light at laser frequencies.

10. A hermetically sealed device comprising:

a substrate providing a base for supporting electronic circuitry thereon;

electronic circuitry disposed on said substrate; and a vitreous glass covering disposed over and hermetically sealing said electronic circuitry with said vitreous glass covering sealed onto said substrate, wherein said substrate is a ceramic comprised of material selected from the group consisting of alumina, beryllia, steatite, titanium dioxide, magnesium alumina silicate, silicon carbide, and zircon *wherein said vitreous glass covering has a sealing temperature below about 380° C. at a pressure above about 100 psi.*

11. The invention as claimed in claim 10 wherein said covering is a ceramic comprised of material selected from the group consisting of alumina, beryllia, steatite, titanium dioxide, magnesium alumina silicate, silicon carbide, and zircon.

12. The invention as claimed in claim 11 wherein said substrate and covering are of the same material and the coefficient of thermal expansion of the material is within about two millionths ($2\times1^{-6}$)°C. of the coefficient of thermal expansion of said vitreous glass seal.

13. The invention as claimed in claim 6 wherein said vitreous glass seal is a uniformly dispersed mixture of silica, soda ash, and lime combined with metal oxides from the group consisting of boron, calcium, lead, lithium, titanium, and cerium.

14. The invention as claimed in claim 13 wherein said covering is of the same material as said seal.

15. A hermetically sealed device comprising:

a ceramic substrate providing a base for supporting electronic circuitry thereon;

electronic circuitry deposited on said substrate;

a vitreous glass covering disposed over said electronic circuitry; and a vitreous glass seal disposed around said electronic circuitry fused to said covering and said substrate to hermetically seal said electronic circuitry, said covering being a separate member from said seal.

16. A hermetically sealed device comprising:

a ceramic substrate providing a base for supporting electronic circuitry thereon;

electronic circuitry deposited on said substrate;

a vitreous glass covering disposed over said electronic circuitry; and a vitreous glass seal disposed around said electronic circuitry fused to said covering and said substrate to hermetically seal said electronic circuitry, wherein said vitreous glass seal has a fusion temperature between 370° C. and 375° C. at substantially 200 psi.

17. The invention as claimed in claim 16 wherein said covering is a vitreous glass having a softening temperature above 420° C. at substantially 200 psi.

18. The invention as claimed in claim 17 wherein the difference in the coefficient of thermal expansion between said vitreous glass covering and said vitreous glass seal is within one millionth ($1\times10^{-6}$).

19. The invention as claimed in claim 18 wherein said vitreous glass covering is a borosilicate glass and is transparent to light at laser frequencies.

20. A hermetically sealed device comprising:

a ceramic substrate providing a base for supporting electronic circuitry thereon;

electronic circuitry deposited on said substrate;

a vitreous glass covering disposed over said electronic circuitry; and a vitreous glass seal disposed around said electronic circuitry fused to said covering and said substrate to hermetically seal said electronic circuitry, wherein said substrate is a ceramic comprised of alumina, and has a coefficient of thermal expansion within one millionth ($1\times10^{-6}$) of the coefficient of thermal expansion of said vitreous glass seal and two millionths ($2\times10^{-6}$) of said vitreous glass covering *wherein said vitreous glass covering has a sealing temperature below about 380° C. at a pressure above about 100 psi.*

21. A hermetically sealed device comprising:

a substrate providing a base for supporting electronic circuitry thereon;

a vitreous glass covering disposed over and heremetically sealing said electronic circuitry with said vitreous glass covering sealed onto said substrate, wherein electronic circuitry is a resistive element tending to become unstable at temperatures above 380° C. *wherein said vitreous glass covering has a sealing temperature below about 380° C. at a pressure above about 100 psi.*

22. The hermetically sealed device as recited in claim 6, wherein electronic circuitry is a resistive element tending to become unstable at temperatures above 380° C.

23. The hermetically sealed device as recited in claim 16, wherein electronic circuitry is a resistive element tending to become unstable at temperatures above 380° C.

* * * * *